United States Patent [19]
Floeter et al.

[11] Patent Number: 6,037,240
[45] Date of Patent: Mar. 14, 2000

[54] GROWTH SUBSTRATE HAVING GROWTH NUCLEI MADE OF DIAMONDS AND/OR DIAMOND-LIKE CARBON ARRANGED ON ITS GROWTH SURFACE AS WELL AS PROCESS FOR A UNIFORM NUCLEATION ON THE GROWTH SUBSTRATE

[75] Inventors: Andre Floeter, Blaustein; Herbert Guettler, Elchingen; Guntmar Schulz, Burlafingen; Reinhard Zachai, Guenzburg; Peter Bodo Gluche, Neu-Ulm; Erhard Kohn, Ulm-Lehr; Paul Ziemann, Erbach, all of Germany

[73] Assignee: Daimlerchrysler AG, Germany

[21] Appl. No.: 09/012,554

[22] Filed: Jan. 23, 1998

Related U.S. Application Data
[60] Provisional application No. 60/037,950, Feb. 20, 1997.

[30] Foreign Application Priority Data

Jan. 23, 1997 [DE] Germany ............ 197 02 311

[51] Int. Cl.⁷ .................................... H01L 21/20
[52] U.S. Cl. ............................... 438/478; 257/77
[58] Field of Search .................. 438/105, 478, 438/479, 488, 503; 117/86, 95, 103, 929; 257/77

[56] References Cited

U.S. PATENT DOCUMENTS

| | | |
|---|---|---|
| 5,397,428 | 3/1995 | Stoner et al. . |
| 5,420,443 | 5/1995 | Dreifus et al. . |
| 5,458,733 | 10/1995 | Tessmer et al. . |
| 5,471,947 | 12/1995 | Tachibana et al. . |
| 5,479,875 | 1/1996 | Southworth et al. . |
| 5,523,160 | 6/1996 | Kobashi et al. . |
| 5,562,769 | 10/1996 | Dreifus et al. . |
| 5,580,380 | 12/1996 | Liu et al. . |
| 5,592,053 | 1/1997 | Fox et al. . |

FOREIGN PATENT DOCUMENTS

WO 94/08076  4/1994  WIPO .

OTHER PUBLICATIONS

S. Yugo et al., "Generation of diamondd nuclei by electric field im plasma chemical vapor deposition", Appl. Phys. Lett. 58 (10) pp. 1036–1038 Mar. 1991.

Appl. Phys. Lett., vol. 68, No. 25, Jun. 17, 1996, pp. 3558–3560, entitled "Nucleation of High Oriented Diamond on Silicon via an Alternating Current Substrate Bias" by Wolter, et al..

*Primary Examiner*—Charles Bowers
*Assistant Examiner*—Keith Christianson
*Attorney, Agent, or Firm*—Evenson, McKeown, Edwards & Lenahan, P.L.L.C.

[57] ABSTRACT

A growth substrate having growth nuclei made of diamond and/or diamond-like carbon arranged on its growth surface, the orientation of over 50% of the growth nuclei deviating by less than 10° from the crystal orientation defined by the growth substrate corresponding to Miller's indices (h, k, l) and the nucleus density changes between the center of the growth substrate and a distance of maximally 15 mm from the center by maximally 80%. The method also relates to a process for the growth substrate's manufacture.

16 Claims, 4 Drawing Sheets

GROWTH SUBSTRATE HAVING GROWTH NUCLEI MADE OF DIAMONDS AND/OR DIAMOND-LIKE CARBON ARRANGED ON ITS GROWTH SURFACE AS WELL AS PROCESS FOR A UNIFORM NUCLEATION ON THE GROWTH SUBSTRATE

This application claims priority from U.S. Provisional Application Ser. No. 60/037,950, filed on Feb. 20, 1997.

BACKGROUND AND SUMMARY OF THE INVENTION

This application claims the priority of German Application No. 197 02 311.8, filed on Jan. 23, 1997, and U.S. Provisional Application Ser. No. 60/037,950, filed Feb. 20, 1997, the disclosures of both of which are expressly incorporated by reference herein.

The invention relates to a growth substrate having growth nuclei made of diamond and/or diamond-like carbon arranged on its growth surface as well as to a process for a uniform nucleation on the growth substrate. This invention is based on the article "Nucleation of High Oriented Diamond on Silicon via an Alternating Current Substrate Bias" by Wolter, et al. in *Appl. Phys. Lett.*, Vol. 68, No. 25, Jun. 17, 1996, Page 3558–3560.

From the Wolter Article it is known to apply an alternating BIAS voltage of a plasma CVD process for nucleation on a growth substrate made of silicon and arranged in an evacuated reactor and pretreated, by growth nuclei made of diamond and/or a diamond-like carbon. As a result, a higher nucleus density of high-precision oriented growth nuclei in comparison to direct-current-type bias voltage is achieved on the growth substrate in otherwise similar conditions. High-precision orientation relates to growth nuclei whose orientation deviates by less than 10° from the crystal orientation defined by the growth substrate corresponding to Miller's indices (h, k, l). Despite the high nucleus density, the nucleation is highly inhomogeneous; that is, high lateral fluctuations occur in the density of high-precision oriented growth nuclei over the whole growth surface of the growth substrate.

From PCT patent application WO 94/08076, it is known for the nucleation on a Si growth substrate to pretreat the Si growth substrate and then provide the nucleation on it in a plasma CVD process from a gaseous phase. For the pretreatment, the growth substrate is installed in a reactor; the reactor is preferably evacuated to less than $10^{-9}$ mbar; and the growth substrate is heated to more than 950° C. As an alternative or supplementation, the growth surface can also be subjected to a plasma treatment which preferably takes place by means of an almost 100% hydrogen plasma at substrate temperatures of between 300° C. and 1,100° C. In this case, it is advantageous to apply a bias voltage of between +50 and −300 v, particularly of approximately −50 v, to the growth substrate. After the cleaning, the nucleation can start in a known manner, the bias voltage advantageously being maintained. For example, CO and $CH_4$, $C_2H_5OH$, acetylene and acetone or, for example, $CF_4$ and methane can be used as the process gases. A preferred combination is hydrogen and methane.

The nucleus density which can be achieved by means of this process is high but the nucleation is highly inhomogeneous because few to almost no high-precision oriented growth nuclei are formed in the center of the growth substrate.

It is an object of the invention to produce a growth substrate with a nucleus density which is more homogeneous over the surface than previously.

According to the invention, this object is achieved by a growth substrate having growth nuclei made of diamond and/or diamond like substances arranged on its surface with over 50% of the nuclei deviating less than 10° from the crystal orientation defined by the substrate according to Miller's indices. A manufacturing process is also defined.

Additional suitable embodiments include a nucleus density between the center of the growth substrate and a distance of maximally 15 mm from the center changing by maximally 50, 30 and 20%, a nucleus density in the center of the growth substrate of $1.10^8$ nuclei per $cm^2$ and $3 \times 10^8$ nuclei per $cm^2$, and a nucleus density between the center of the growth substrate and a distance maximally 15 mm from amounts to between $1 \times 10^8$ nuclei per $cm^2$ and $5 \times 10^8$ nuclei per $cm^2$ and $3.5 \times 10^8$ nucleii per $cm^2$ and $5.10^8$ nuclei $cm^2$.

Suitable embodiments of the process claims include employing bias voltages between −30 and −130 volts, frequencies between 1 and 100 Hz, 1 and 10 Hz, and a frequency at 5 Hz. Process embodiments also include varying active ($t_{on}$) and currentless ($t_{off}$) voltage values and using growth substrates of silicon and β-silicon carbide.

Other objects, advantages and novel features of the present invention will become apparent from the following detailed description of the invention when considered in conjunction with the accompanying drawings.

DETAILED DESCRIPTION OF THE INVENTION

The nucleation on the growth substrates illustrated in the following took place at largely the same CVD process conditions in a reactor which can be evacuated. The only difference was the frequency of the AC-bias voltage.

The basic process course consists of plasma etching for cleaning the growth surface. For this purpose, the reactor was pumped down to approximately $10^{-8}$ mbar and the plasma etching was carried out in an $H_2$ plasma without any bias voltage at a substrate temperature of 810° C.

Plasma etching is followed by bias pretreatment. A periodic alternating voltage of between 0.5 and 500 Hz with a maximal amplitude in the amount of 230 v is applied to the substrate. $H_2$, $CH_4$, $N_2$ and $O_2$ are used as process gases. The growth substrate, which is particularly formed of silicon, is heated to a temperature of between 870° C. and 890° C. The bias pretreatment is concluded when a sufficient nucleation by diamond is detected on the growth surface of the Si growth substrate by the rise of the amount of the median bias current.

The bias pretreatment may be followed by the growth of the diamond layer, in which case the growth parameter α is adjusted by means of the formula $$\alpha = \frac{V_{100}}{V_{111}} \cdot \sqrt{3}$$

wherein $v_{110}$: rate of growth in the <100>-direction, and $V_{111}$: rate of growth in the <111>-direction, in which case, <abc> corresponds to Miller's indices in crystallography, to a value of between 2 and 3.

Figure 1:
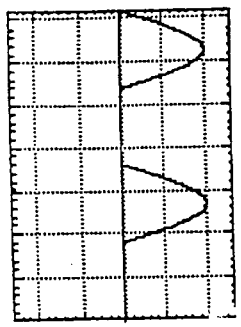
FIG. 1 is a view of a full-wave-rectified sinusoidal voltage as the bias voltage.
Figure 2:
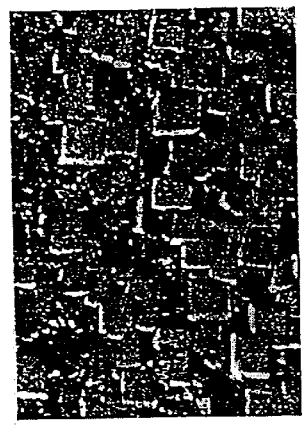
FIG. 2 is a view of a growth surface of a Si growth substrate which is provided with nucleation by means of a bias voltage according to FIG. 1.

FIG. 1 illustrates a time sequence of an alternating-current-type (AC) bias-voltage as applied during the nucleation on a silicon growth substrate according to FIG. 2. For implementing this bias voltage, a sinusoidal voltage of a frequency of 50 Hertz (s−1) was full-wave-rectified. The maximal voltage applied to the growth substrate was 0 volts, and the lowest voltage was −200 volts. The largest amount of the electric voltage was therefore 200 volts.

FIG. 2 is a cutout of the growth surface provided with the nucleation by means of a bias voltage according to FIG. 1 at a distance of approximately 15 mm from the center of the growth substrate enlarged 10,000 times.

The quality of nucleation is relatively poor because only a small percentage of the forming growth nuclei deviate well, that is, by less than 10° with respect to the crystal axes deviating from the crystal axes defined by the growth substrate. After the nucleation, the samples were coated for one hour under growth conditions α=2 . . . 3. The nucleus densities were then determined by means of scanning electron microscope pictures (REM) by a manual counting of the nuclei which have a faulty in-plane orientation of <10%. The number of the oriented nuclei is >80%. Nuclei size depends on the coating time.

Figure 3:
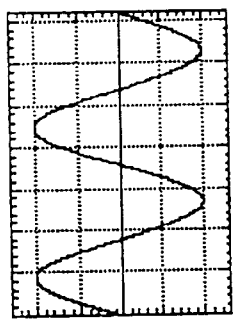
FIG. 3 is a view of a sinusoidal voltage as the bias voltage.
Figure 4:
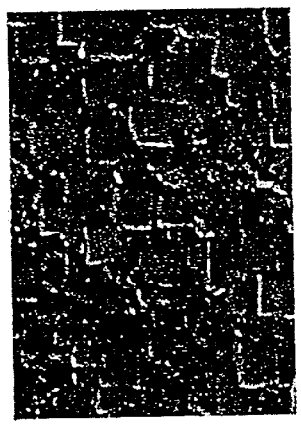
FIG. 4 is a view of a growth surface of a Si growth substrate provided with nucleation by means of a bias voltage according to FIG. 3.

FIG. 3 illustrates a time sequence of an alternating-voltage-type (AC) bias voltage as it was applied during the nucleation on a silicon growth substrate according FIG. 4. A normal sinusoidal voltage of a frequency of 50 Hertz (Hz) was used as the bias voltage. The respective maximal voltage applied to the growth substrate was 200 volts and the lowest voltage was −200 volts. The largest amount of the electrical voltage was therefore 200 volts.

FIG. 4 is a cutout of the growth surface provided with the nucleation by means of a bias voltage according to FIG. 3 at a distance of approximately 10 mm from the center of the growth substrate enlarged 10,000 times. The quality of the nucleation is better than the embodiment of FIG. 2 because the percentage of forming highly oriented growth nuclei is higher.

Figure 5:
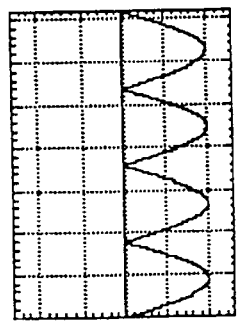
FIG. 5 is a view of a half-wave-rectified sinusoidal voltage as the bias voltage.
Figure 6:
FIG. 6 is a view of a growth surface of a Si growth substrate provided with nucleation by means of a bias voltage according to FIG. 1.

FIG. 5 illustrates a time sequence of an alternating-voltage-type (AC) bias voltage as it was applied during the nucleation on a silicon growth substrate according FIG. 6. For implementing this bias voltage, a sinusoidal voltage of a frequency of 50 Hertz (Hz) was half-wave-rectified so that only the negative half-wave is used. The maximal voltage applied to the growth substrate was 0 volts and the lowest voltage was −200 volts. The largest amount of the electrical voltage was therefore 200 volts.

It is advantageous in the case of this preferred wave form of the bias voltage to adjust the wave form such that its negative peak voltage is lower than −30 V, particularly lower than −50 V; that, within a period, the bias voltage is in each case applied for a predeterminable active time $t_{on}$ with a value lower than −30 V; and that within the same period, the bias voltage for a defined currentless time $t_{off}$ in an interval is higher than −30 V.

FIG. 6 is a cutout of the growth surface provided with the nucleation by means of a bias voltage according to FIG. 5 at a distance of approximately 10 mm from the center of the growth substrate enlarged 10,000 times. The quality of the nucleation is the best that has been reached. The percentage of the forming growth nuclei is the highest.

In the following, five embodiments (Sample 1 to Sample 5) are illustrated which were provided with a nucleation at identical wave forms of the bias voltage but at different frequencies. In Sample 1, the frequency was 0.5 Hz; in Sample 2, the frequency was 5 Hz; Sample 3, the frequency was 50 Hz; and Sample 4, the frequency was 500 Hz. In all samples 1 to 4, the voltage of the bias voltage was between 0 V and −200 V, during the currentless time $t_{off}$, the voltage amounting to 0 V. Simultaneously, the wave form of the bias voltage was adjusted such that the currentless time $t_{off}$ corresponded approximately to the duration of the active time $t_{on}$.

Figure 7:
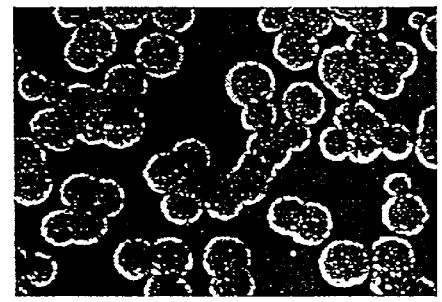
FIG. 7 is a view of the center of a growth surface with diamond nucleation (Welcher detection) in the case of a half-wave-rectified bias voltage of 0.5 Hertz.
Figure 8:
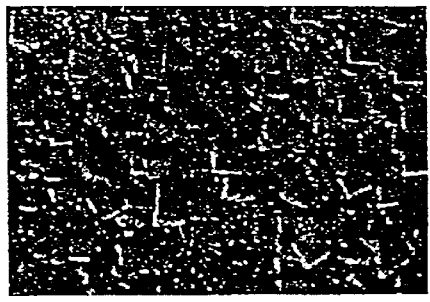
FIG. 8 is a view of the growth surface of the growth substrate according to FIG. 7 at a distance of approximately 10 mm from the center.

FIGS. 7 and 8 both show a cutout of the growth surface at different distances from the center of the growth surface of Sample 1. For the purpose of nucleation, a bias voltage of 0.5 Hz was applied to Sample 1, which voltage also meets the above-mentioned criteria and with respect to its type approximately corresponds to that of FIG. 5. FIGS. 7 and 8 are enlarged 10,000 times.

The conditions during the nucleation on Sample 1 by means of plasma CVD are listed in the following.

| Sample 1 | Etching | Bias Treatment | Growth |
|---|---|---|---|
| Bias Voltage | — | sinudoidal, half-wave rectified | — |
| Bias Voltage Value | — | 0 V to −200 V | — |
| Bias Frequency | 0 | 0.5 Hz | 0 |
| $H_2$ in sccm | 1,500 | 1,500 | 1,500 |
| $CH_4$ in % | — | 1.0 | 1.7 |
| $N_2$ in ppm | 5 | 50 | 60 |
| $O_2$ in ppm | 5 | 25 | — |
| Microwave power in W | 2,500 | 2,500 | 2,500 |
| Temperature in ° C. | 810 | 879 | 830 |
| pressure in mbar | 21.8 | 32.3 | 21.0 |
| Time in min | 5 | 20 | 60 |

Nucleation in the area of the center of the growth surface of Sample 1—as illustrated in FIG. 7—is limited to small islands. The nucleation on the growth surface at a distance of 10 mm from the center is illustrated in FIG. 8 and is improved with respect to the nucleation in the center.

Figure 17:
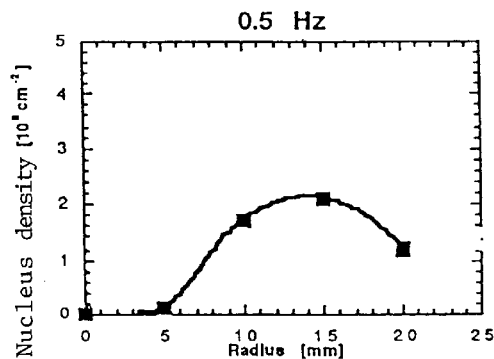
FIG. 17 is a view of the course of the nucleus density as a function of the distance from the center in the case of the growth substrate according to FIG. 7.

FIG. 17 illustrates the nucleus density of oriented nuclei on the growth surface of Sample 1 as a function of the distance from the center, in which case the nucleus density is entered as $10^8$ nuclei per $cm^2$, and the distance from the center of the growth surface of the growth substrate of Sample 1 is entered in mm.

The diagram according to FIG. 17 shows that the nucleus density of Sample 1 improves steadily with an increasing distance from the center and, at a distance of approximately 14–15 mm from the center, has a maximum with a nucleus density of approximately $2.2 \times 10^8$ nuclei per $cm^2$. Then the nucleus density decreases again but, at a distance of approximately 20 mm, still has a nucleus density of approximately $1.1 \times 10^8$ nuclei per $cm^2$. In the given item, the nucleus density in the center of Sample 1 is not worth mentioning.

On the whole, it should be stated that the homogeneity of the nucleus density over the growth surface of Sample 1 has a good value only at a distance of between 10 and 20 mm from the center and, in the area from the center to a distance of 10 mm, is poor.

For establishing the diagram according to FIG. 17 and also according to FIGS. 18 to 21, the nucleus density was determined by analysis of REM. For this purpose, all those crystals were manually marked as being oriented whose azimuthal orientation was tilted or rotated by less than 10° with respect to the growth substrate.

Figure 9:
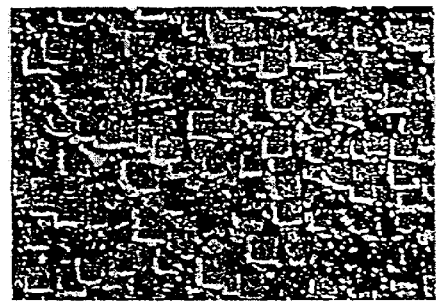
FIG. 9 is a view of the center of a growth surface with diamond nucleation (Welcher detection) in the case of a half-wave-rectified bias voltage of 5 Hertz.
Figure 10:
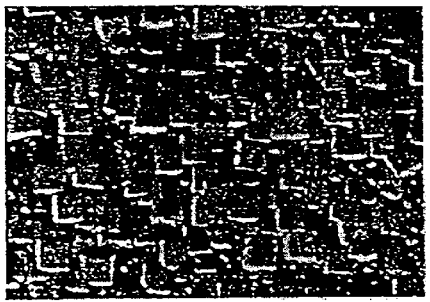
FIG. 10 is a view of the growth surface of the growth substrate according to FIG. 9 at a distance of approximately 10 mm from the center.

FIGS. 9 and 10 each show a cutout of the growth surface at different distances from the center of the growth surface of Sample 2. In contrast to Sample 1, the nucleation was carried out here at a frequency of the bias voltage of 5 Hz. Here also, FIGS. 9 and 10 are enlarged 10,000 times.

The conditions during the nucleation on Sample 2 by means of plasma CVD are:

| Sample 2 | Etching | Bias Treatment | Growth |
|---|---|---|---|
| Bias Voltage | — | sinudoidal, half-wave rectified | — |
| Bias Voltage Value | — | 0 V to −200 V | — |
| Bias Frequency | 0 | 5 Hz | 0 |

-continued

| Sample 2 | Etching | Bias Treatment | Growth |
|---|---|---|---|
| $H_2$ in sccm | 1,500 | 1,500 | 1,500 |
| $CH_4$ in % | — | 1.0 | 1.7 |
| $N_2$ in ppm | 5 | 50 | 60 |
| $O_2$ in ppm | 5 | 25 | — |
| Microwave power in W | 2,500 | 2,500 | 2,500 |
| Temperature in ° C. | 810 | 880 | 830 |
| Pressure in mbar | 21.8 | 32.8 | 21.6 |
| Time in min | 5 | 20 | 60 |

Nucleation in the area of the center of the growth surface of Sample 2—as illustrated in FIG. 9—is good. Nucleation on the growth surface at a distance of 10 mm from the center is illustrated in FIG. 8 and is still improved with respect to the nucleation in the center.

Figure 18:
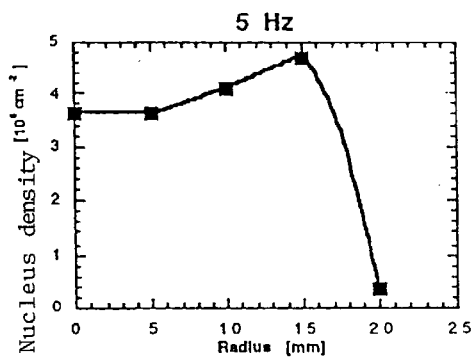
FIG. 18 is a view of the course of the nucleus density as a function of the distance from the center in the case of the growth substrate according to FIG. 9.

FIG. 18 illustrates the nucleus density of oriented nuclei on the growth surface of Sample 2 as a function of the distance from the center, where the nucleus density is entered as $10^8$ nuclei per $cm^2$ and the distance from the center of the growth surface of the growth substrate of Sample 2 is entered in mm.

As illustrated in the diagram of FIG. 18, the nucleus density of Sample 2 has a value of approximately $3.6 \times 10^8$ nuclei per $cm^2$ in the center. Here also, the nucleus density increases steadily with an increasing distance form the center and, at a distance of approximately 14–15 mm from the center, has a maximum with a nucleus density of approximately $4.8 \times 10^8$ nuclei per $cm^2$. Then the nucleus density decreases rapidly and, at a distance of approximately 20 mm from the center, only has a nucleus density of approximately $0.2 \times 10^8$ nuclei per $cm^2$. The difference between nucleus density in the center and the maximal nucleus density in Sample 2 amounts to approximately $1.2 \times 10^8$ nuclei per $cm^2$, approximately 25%. On the whole, it should be stated that the homogeneity of the nucleus density over the growth surface of Sample 2 has the best result of Samples 1–4.

Figure 11:
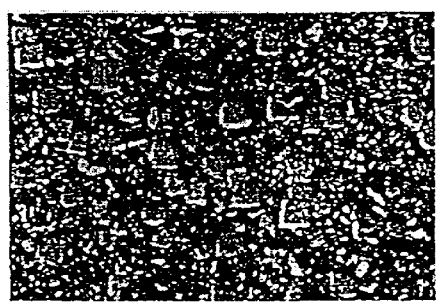
FIG. 11 is a view of the center of a growth surface with diamond nucleation (Welcher detection) in the case of a half-wave-rectified bias voltage of 50 Hertz.
Figure 12:
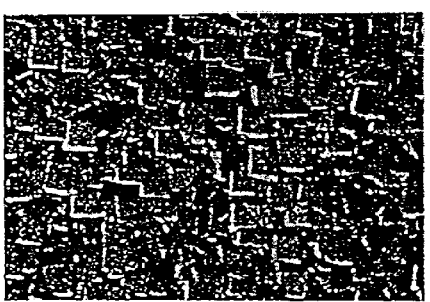
FIG. 12 is a view of the growth surface of the growth substrate according to FIG. 11 at a distance of approximately 10 mm from the center.

FIGS. 11 and 12 show a cutout of the growth surface at different distances from the center of the growth surface of Sample 3. In contrast to Samples 1 and 2, the nucleation on Sample 3 was carried out at a frequency of the bias voltage of 50 Hz. FIGS. 11 and 12 also are enlarged 10,000 times.

The conditions during the nucleation of Sample 3 by means of plasma CVD are:

| Sample 3 | Etching | Bias Treatment | Growth |
|---|---|---|---|
| Bias Voltage | — | sinudoidal, half-wave rectified | — |
| Bias Voltage Value | — | 0 V to −200 V | — |
| Bias Frequency | 0 | 50 Hz | 0 |
| $H_2$ in sccm | 1,500 | 1,500 | 1,500 |
| $CH_4$ in % | — | 1.0 | 1.7 |
| $N_2$ in ppm | 5 | 50 | 60 |
| $O_2$ in ppm | 5 | 25 | — |
| Microwave power in W | 2,500 | 2,500 | 2,500 |
| Temperature in ° C. | 810 | 879 | 830 |
| pressure in mbar | 21.6 | 32.3 | 21.7 |
| Time in min | 5 | 20 | 60 |

Nucleation in the area of the center of the growth surface of Sample 3—as illustrated in FIG. 11—is better than in the case of Sample 1 but poorer than in the case of Sample 2. The nucleation on the growth surface at a distance of 10 mm from the center is illustrated in FIG. 12 and is improved with respect to nucleation in the center.

Figure 19:
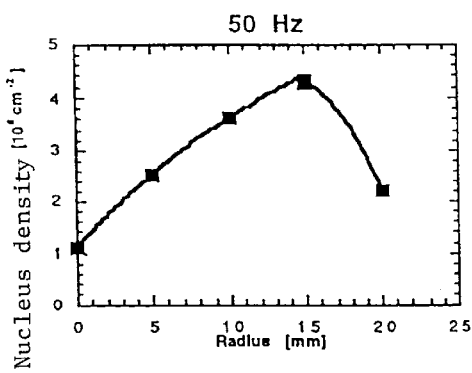
FIG. 19 is a view of the course of the nucleus density as a function of the distance from the center in the case of the growth substrate according to FIG. 11.

FIG. 19 illustrates nucleus density of oriented nuclei on the growth surface of Sample 3 as a function of the distance from the center, in which case the nucleus density is entered as $10^8$ nuclei per $cm^2$ and the distance from the center of the growth surface of the growth substrate of Sample 3 is entered in mm.

As illustrated in the diagram of FIG. 19, the nucleus density of Sample 3 has a value of approximately $1 \times 10^8$ nuclei per $cm^2$ in the center. The nucleus density increases steadily and significantly with an increasing distance from the center and, at a distance of approximately 14–15 mm from the center, has a maximum with a nucleus density of approximately $4.4 \times 10^8$ nuclei per $cm^2$. Then, the nucleus density decreases rapidly and, at a distance of approximately 20 mm, still has a nucleus density of approximately $2.2 \times 10^8$ nuclei per $cm^2$. The drop of the nucleus density after the maximum is less than in the case of that of Sample 2. On the whole, it should be stated that, although the homogeneity of the nucleus density is poorer than in Sample 2, it can nevertheless be considered good particularly in a distance range between approximately 0.5 mm and 20 mm from the center.

Figure 13:
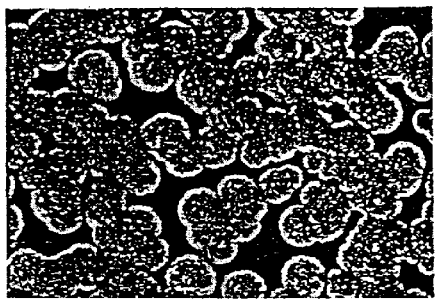
FIG. 13 is a view of the center of a growth surface with diamond nucleation (Welcher detection) in the case of a half-wave-rectified bias voltage of 500 Hertz.
Figure 14:
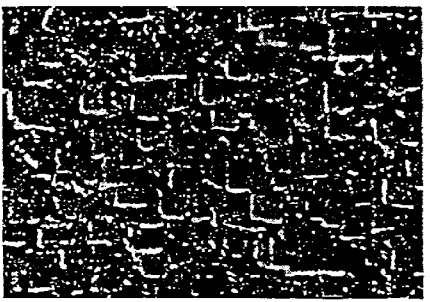
FIG. 14 is a view of the growth surface of the growth substrate according to FIG. 13 at a distance of approximately 10 mm from the center.

FIGS. 13 and 14 each show a cutout of the growth surface at different distances from the center of the growth surface of Sample 4. In contrast to Samples 1 to 3, the nucleation on Sample 4 was carried out at a frequency of the bias voltage of 500 Hz. FIGS. 13 and 14 have been enlarged 10,000 times.

The conditions during nucleation on Sample 4 by means of plasma CVD are:

| Sample 4 | Etching | Bias Treatment | Growth |
|---|---|---|---|
| Bias Voltage | — | sinudoidal, half-wave rectified | — |
| Bias Voltage Value | — | 0 V to −200 V | — |
| Bias Frequency | 0 | 500 Hz | 0 |
| $H_2$ in sccm | 1,500 | 1,500 | 1,500 |
| $CH_4$ in % | — | 1.0 | 1.7 |
| $N_2$ in ppm | 5 | 50 | 60 |
| $O_2$ in ppm | 5 | 25 | — |
| Microwave power in W | 2,500 | 2,500 | 2,500 |
| Temperature in °C. | 810 | 879 | 830 |
| pressure in mbar | 21.7 | 32.2 | 21.2 |
| Time in min | 5 | 20 | 60 |

Nucleation in the area of the center of the growth surface of Sample 4—as illustrated in FIG. 13—is limited to individual islands which on the edge side are partly connected with one another. In principle, the nucleation looks like the one of Sample 1 (see FIG. 7) but is nevertheless better because a higher nucleus density exists. The nucleation on the growth surface at a distance of 10 mm from the center is illustrated in FIG. 14 and is improved with respect to the nucleation in the center.

Figure 20:
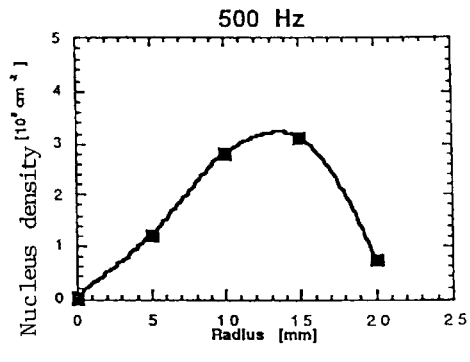
FIG. 20 is a view of the course of the nucleus density as a function of the distance from the center in the case of the growth substrate according to FIG. 13.

FIG. 20 illustrates nucleus density of oriented nuclei on the growth surface of Sample 4 as a function of the distance from the center, in which case the nucleus density is entered as $_{10}^8$ nuclei per $cm^2$ and the distance from the center of the growth surface of the growth substrate of Sample 4 is entered in mm.

As illustrated in the diagram according to FIG. 20, the nucleus density of Sample 4 has a value in the center which is not worth mentioning in the entered item of $1 \times 10^8$ nuclei per $cm^2$. The nucleus density steadily and very significantly increases with an increasing distance from the center and, at a distance of approximately 14–15 mm from the center, has a maximum with a nucleus density of approximately $3.4 \times 10^8$ nuclei per $cm^2$. Subsequently, the nucleus density decreases rapidly and, at a distance of approximately 20 mm still has a nucleus density of approximately $0.8 \times 10^8$ nuclei per $cm^2$. On the whole, it should be stated that, although the homogeneity of the nucleus density is poorer than in Samples 1 and 2, it can nevertheless be considered acceptable in a distance range between approximately 0.5 mm and 20 mm from the center. In general, the homogeneity of the nucleus density of Sample 4 is better than Sample 1.

Figure 15:
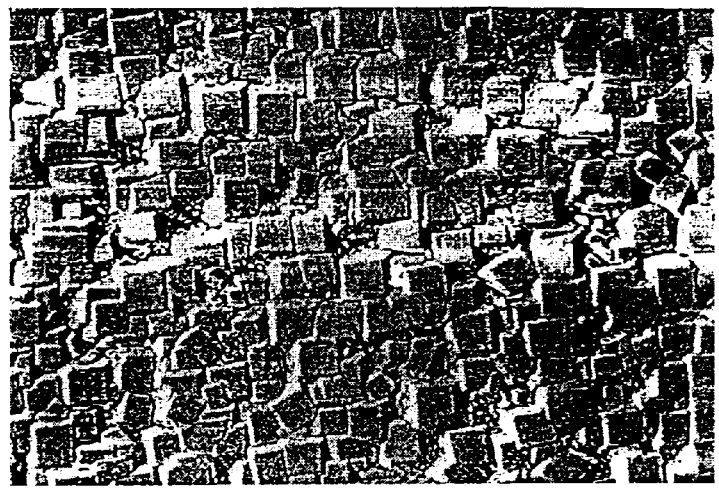
FIG. 15 is a view of the center of a growth surface with diamond nucleation (Welcher detection) in the case of a half-wave-rectified bias voltage of 10 Hertz.
Figure 16:
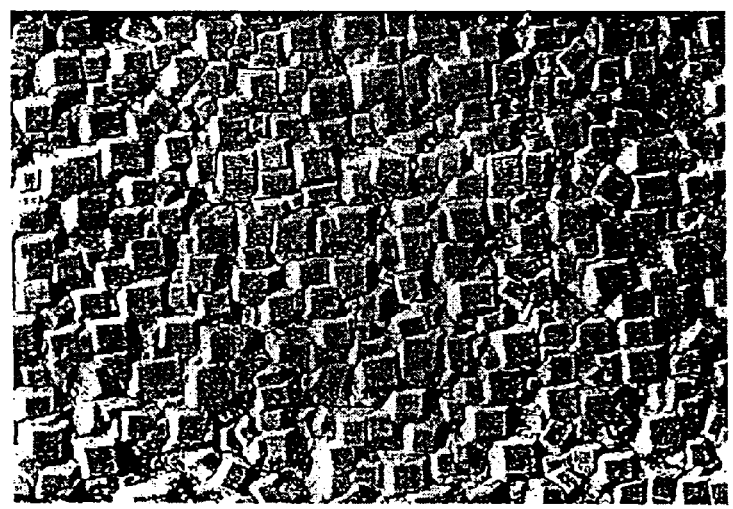
FIG. 16 is a view of the growth surface of the growth substrate according to FIG. 15 at a distance of approximately 10 mm from the center.

FIGS. 15 and 16 each show a cutout of the growth surface at different distances from the center of the growth surface of Sample 5. The nucleation was carried out at a frequency of the bias voltage of 10 Hz. FIGS. 15 and 16 are enlarged 10,000 times.

The conditions during nucleation on Sample 5 by means of plasma CVD are:

| Sample 5 | Etching | Bias Treatment | Growth |
|---|---|---|---|
| Bias Voltage | — | sinudoidal, half-wave rectified | — |
| Bias Voltage Value | — | 0 V to −230 V | — |
| Bias Frequency | 0 | 10 Hz | 0 |
| $H_2$ in sccm | 1,500 | 1,500 | 1,500 |
| $CH_4$ in % | — | 0.7 | 1.7 |
| $N_2$ in ppm | 5 | 50 | 51 |
| $O_2$ in ppm | 5 | 25 | |
| Microwave power in W | 2,500 | 2,500 | 2,500 |
| Temperature in °C. | 810 | 872 | 750 |
| pressure in mbar | 25 | 35 | 19 |
| Time in min | 5 | 20 | 300 |

As illustrated above the results of Sample 5 cannot be compared directly with the results of Samples 1 to 4 because the plasma geometry was slightly different and the sample was also subsequently coated for 5 hours after the actual nucleation.

Figure 21:
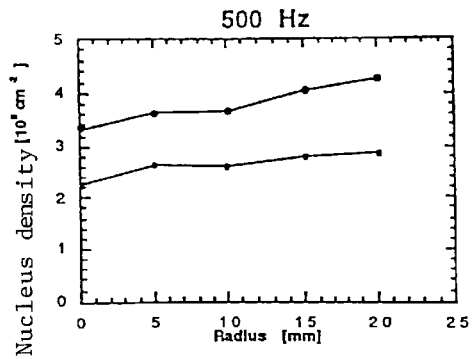
FIG. 21 is a view of the course of the nucleus density as a function of the distance from the center in the case of the growth substrate according to FIG. 15.

Nevertheless, FIG. 21 also very clearly shows a very good radial homogeneity of nucleus density of oriented nuclei. Compared to previous examples, the absolute values of the nucleus densities are shifted toward slightly lower values which is a result of the large layer thicknesses.

Nucleation in the area of the center of the growth surface of Sample 5 is good—as illustrated in FIG. 15. The nucleation on the growth surface at a distance of 10 mm from the center is also good, as illustrated in FIG. 21.

FIG. 21 illustrates the nucleus density on the growth surface of Sample 5 as a function of the distance from the center, in which case the nucleus density is entered as $10^8$ nuclei per $cm^2$ and the distance from the center of the growth surface of the growth substrate of Sample 5 is entered in mm. This diagram also shows the total nucleus density (by points) and also the nucleus density at the highly oriented nuclei (square points).

As illustrated in the diagram according to FIG. 21, the nucleus density of oriented nuclei of Sample 5 has a value of approximately $2.4 \times 10^8$ nuclei per $cm^2$ in the center, while total nucleus density amounts to approximately $3.4 \times 10^8$ nuclei per $cm^2$. In contrast to Samples 1 to 4, no maximum of the nucleus density is formed here. On the contrary, the nucleus density increases toward the outside. Thus, the oriented nucleus density at a distance of 20 mm from the center amounts to approximately $3.8 \times 10^8$ nuclei per $cm^2$, and the total nucleus density amounts to approximately $5.8 \times 10^8$ nuclei per $cm^2$. On the whole, it should be stated that the homogeneity of the nucleus density over the growth surface of Sample 5 is good, in which case, starting at a distance of between 10 and 15 mm from the center, the total nucleus density increases more than the oriented nucleus density.

Concerning Samples 1 to 5, the homogeneity of the nucleus density is a function of the frequency; with an increasing frequency of up to approximately 500 Hz, is improved, and has the best result in a frequency range around 5 Hz.

Instead of a growth substrate made of crystalline Si, a growth substrate made of crystalline β silicon carbide (β SiC) can be selected.

Although the invention has been described and illustrated in detail, it is to be clearly understood that the same is by way of illustration and example, and is not to be taken by way of limitation. The spirit and scope of the present invention are to be limited only by the terms of the appended claims.

What is claimed is:

1. A process for uniform nucleation on a growth substrate using at least one of diamond and a diamond-like carbon from a gaseous phase, comprising:
   (a) pretreating the substrate,
   (b) arranging the substrate in a reactor, and
   (c) applying a bias voltage in the form of an alternating voltage to the substrate and supplying gases to the growth substrate,
   wherein a frequency of between 0.5 and 500 Hz is the frequency for the bias voltage and its negative peak voltage is less than −30 V, and within a period, the bias voltage is applied during an active time ($t_{on}$) with a value of less than −30 V, and within the period, the bias voltage for a currentless time ($t_{off}$) in an interval is higher than 30 V.

2. The process according to claim 1, wherein the bias voltage in the currentless time ($t_{off}$) is between −30 V and +30 V.

3. The process according to claim 1, wherein the frequency is between 1 and 100 Hz.

4. The process according to claim 1, wherein the frequency is between 1 and 10 Hz.

5. The process according to claim 1, wherein, within a period, the bias voltage for an active time ($t_{on}$) is applied at a value lower than −30 V, and within the period, the bias voltage is applied for a currentless time ($t_{off}$) in an interval within ±30 v, and the active time ($t_{on}$) is adjusted to be approximately as long as the currentless time ($t_{off}$).

6. The process according to claim 1, wherein within a period, the bias voltage for a defined active time ($t_{on}$) is applied at a value lower than −30 V, and within the period, the bias voltage is applied for a currentless time ($t_{off}$) in an interval within ±30 v, the sum of the active and the currentless time being selected as a period duration of the period.

7. The process according to claim 1, wherein the bias voltage is applied within a period in each case for a certain time ($t_{on}$) and is switched off for a certain time ($t_{off}$).

8. The process according to claim 1, wherein a growth substrate made of silicon is selected.

9. The process according to claim 1, wherein a growth substrate made of β silicon carbide (β-SiC) is selected.

10. The process according to claim 1 occurring by plasma chemical vapor deposition (CVD).

11. The process according to claim 4 employing a frequency of approximately 5 Hz.

12. The process according to claim 1, wherein the bias voltage and its negative peak voltage is less than −50 v.

13. The process according to claim 1, wherein said gases comprise $H_2$, $CH_4$, $N_2$ and $O_2$.

14. A process for forming a diamond or a diamond-like carbon layer on a growth substrate, comprising:
   (a) pretreating the substrate,
   (b) arranging the substrate in a reactor, and
   (c) applying a bias voltage in the form of an alternating voltage to the substrate and supplying gases to the growth substrate,
   wherein a frequency of between 0.5 and 500 Hz is the frequency for the bias voltage and its negative peak voltage is less than −30 V, and within a period, the bias voltage is applied during a active time ($t_{on}$) with a value of less than −30 V, and within the period, the bias voltage for a currentless time ($t_{off}$) in an interval is higher than 30 V;
   forming diamond or a diamond-like carbon nuclei on a surface of the growth substrate; and
   forming the diamond or the diamond-like carbon layer on the surface of the growth substrate.

15. The process according to claim 14, wherein said forming of the diamond or diamond-like carbon layer is according to a growth rate defined as $$\alpha = \frac{V_{100}}{V_{111}}\sqrt{3}$$

wherein α is between 2 and 3, and
   wherein $V_{100}$ is a growth rate in the <100> direction, and $V_{111}$ is a growth rate in the <111> direction, wherein the <100> and <111> directions are according to Miller's indices for crystallography.

16. The process according to claim 14, wherein said gases comprise $H_2$, $CH_4$, $N_2$ and $O_2$.

* * * * *